US010256943B2

(12) United States Patent
Gattami

(10) Patent No.: US 10,256,943 B2
(45) Date of Patent: Apr. 9, 2019

(54) DECODING OF A MESSAGE AND CORRESPONDING ENCODING OF A MESSAGE

(71) Applicant: Telefonaktiebolaget LM Ericsson (publ), Stockholm (SE)

(72) Inventor: Ather Gattami, Stockholm (SE)

(73) Assignee: Telefonactiebolaget LM Ericsson (Publ), Stockholm (SE)

( * ) Notice: Subject to any disclaimer, the term of this patent is extended or adjusted under 35 U.S.C. 154(b) by 1 day.

(21) Appl. No.: 15/105,243

(22) PCT Filed: Dec. 17, 2013

(86) PCT No.: PCT/SE2013/051542
§ 371 (c)(1),
(2) Date: Jun. 16, 2016

(87) PCT Pub. No.: WO2015/094037
PCT Pub. Date: Jun. 25, 2015

(65) Prior Publication Data
US 2017/0019209 A1  Jan. 19, 2017

(51) Int. Cl.
H03M 13/00 (2006.01)
H04L 1/00 (2006.01)
H03M 13/37 (2006.01)

(52) U.S. Cl.
CPC ...... *H04L 1/0041* (2013.01); *H03M 13/3761* (2013.01); *H04L 1/0045* (2013.01); *H04L 1/0058* (2013.01)

(58) Field of Classification Search
CPC ... H04L 1/0041; H04L 1/0045; H04L 1/0058; H03M 13/3761
See application file for complete search history.

(56) References Cited

U.S. PATENT DOCUMENTS 8,005,990 B2 *  8/2011  Khalil ............... H03M 13/1111
                                                        341/50
8,228,800 B2 *  7/2012  Mehrotra ............. H04L 1/0002
                                                        370/235
(Continued)

FOREIGN PATENT DOCUMENTS

CN    102164026 A    8/2011
KR    20130021631 A  3/2013
WO    2007092214 A1  8/2007

OTHER PUBLICATIONS

Barros, Joao et al., "Effective Delay Control in Online Network Coding", IEEE INFOCOM 2009, Rio de Janeiro, Apr. 19-25, 2009, 208-216.

(Continued)

*Primary Examiner* — Esaw T Abraham
(74) *Attorney, Agent, or Firm* — Patent Portfolio Builders, PLLC

(57) ABSTRACT

The present disclosure concerns radio communication. More particularly, the disclosure relates to encoding/decoding. A method is performed by a receiver (300) for decoding data from a message which is received from a transmitter (100). The receiver (300) is generally configured to use a decoding matrix in the decoding. Furthermore, the message is typically split into a pre-defined number of sub-messages. The receiver (300) receives data packets from the transmitter (100), wherein the received data packets are formed according to a certain structure. Furthermore, the receiver (300) decodes the received data packets as the data packets are received and the decoding is performed sequentially with the arrival (i.e. reception) of the data packets. Hereby it is made possible to reduce, and thus received improve, the latency.

5 Claims, 6 Drawing Sheets

(56) References Cited

U.S. PATENT DOCUMENTS

| | | | | |
|---|---|---|---|---|
| 8,279,781 | B2* | 10/2012 | Lucani | H04L 1/0041 |
| | | | | 370/276 |
| 8,516,344 | B2* | 8/2013 | Kim | H04B 7/15592 |
| | | | | 714/774 |
| 8,532,143 | B2* | 9/2013 | Achir | H03M 13/1105 |
| | | | | 370/252 |
| 8,671,332 | B2* | 3/2014 | Hammons, Jr. | H04L 1/1812 |
| | | | | 370/204 |
| 9,160,440 | B1* | 10/2015 | Medard | H04B 7/15521 |
| 2008/0320104 | A1 | 12/2008 | Turner et al. | |
| 2010/0046371 | A1 | 2/2010 | Sundararajan et al. | |

OTHER PUBLICATIONS

Joshi, Gauri et al. "Fountain Codes", 6.972 Principles of Digital Communication II, Dec. 7, 2010, 1-34.

Keller, Lorenzo et al., "Online Broadcasting with Network Coding", IEEE, 2008 Fourth Workshop on Network Coding, Theory and Applications, Hong Kong, Jan. 3-4, 2008, 1-6.

Qureshi, Jalaluddin et al., "Triangular Code: Rateless Systematic Erasure Code for Finite Length Input Symbols", ResearchGate, 1-12.

Sadeghi, Parastoo et al., "Adaptive Network Coding for Broadcast Channels", IEEE, 2009 Workshop on Network Coding, Theory, and Applications, Lausanne, Jun. 15-16, 2009, 80-85.

\* cited by examiner

DECODING OF A MESSAGE AND CORRESPONDING ENCODING OF A MESSAGE

TECHNICAL FIELD

Embodiments of the present technology presented herein generally relate to decoding and corresponding encoding. More particularly, the embodiments presented herein relate to methods, a transmitter and a receiver for decoding data from a message received from the transmitter, wherein the receiver uses a decoding matrix in the decoding.

BACKGROUND

Radio communication networks are widely deployed to provide various communication services such as telephony, video, data, messaging, broadcasts, and so on. Such communication networks generally support communications for multiple user equipments (UEs) by sharing available network resources. One example of such a network is the Universal Mobile Telecommunications System (UMTS), a third generation (3G) mobile phone technology standardized by the 3rd Generation Partnership Project (3GPP). UMTS includes a definition for a Radio Access Network (RAN), referred to as Universal Terrestrial Radio Access Network (UTRAN). The UMTS, which is the successor to Global System for Mobile Communications (GSM) technologies, supports various air interface standards, such as Wideband Code Division Multiple Access (WCDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSPA), which provides higher data transfer speeds and capacity to associated UMTS networks. As the demand for mobile broadband access continues to increase, research and development continue to advance the UMTS technologies not only to meet the growing demand for mobile broadband access, but to advance and enhance the user experience with wireless communications. For example, UMTS based on WCDMA has been deployed in many places around the world. To ensure that this system remains competitive in the future, 3GPP began a project to define the long-term evolution of UMTS cellular technology. The specifications related to this effort are formally known as Evolved UMTS Terrestrial Radio Access (EUTRA) and Evolved UMTS Terrestrial Radio Access Network (EU-TRAN), but are more commonly referred to by the name Long Term Evolution (LTE).

Transmissions over communication channels are generally subject to errors, for example due to variations in the received signal quality. To some degree, such variations may be counteracted through link adaptation, which deals with how to set transmission parameters of a radio link to handle variations in radio link quality. However, receiver noise and unpredictable interference variations may not be counteracted by link adaptation. Therefore, virtually all wireless communication systems including those described hereinabove employ some form of Forward Error Correction (FEC). Another approach to handle transmission errors is to use Automatic Repeat Request (ARQ). Most modern radio communication networks employ a combination of FEC and ARQ, known as Hybrid ARQ (HARQ). Optionally, hybrid ARQ may also use soft combining. More detailed descriptions of advanced retransmission schemes may be found in literature, such as in chapters 6.3 and 6.4 of the reference book 4G LTE/LTE-Advanced for Mobile Broadband by Erik Dahlman, Stefan Parkvall and Johan Skold, Academic Press, 2011, ISBN: 978-0-12-385489-6.

With the continuing development of radio communication networks, the radio communication networks are getting more and more automated. To this end, Machine Type Communication (MTC) (also known as machine-to-machine communication) has been introduced. One example scenario using MTC may be found in vehicle-to-vehicle communications where autonomous MTC devices of the vehicles communicate their state (e.g. position, velocity, etc.) in order to maintain a safe distance between each other to avoid collisions. This scenario and other future scenarios will typically demand a low communication delay over a communication channel. In turn, this will impose demands on the performance of the communication of messages between transmitters and receivers in terms of low latency.

SUMMARY

It is in view of the above considerations and others that the various embodiments disclosed herein have been made. A general object of embodiments presented herein is therefore to reduce, and thus improve, the latency when a message is transmitted from a transmitter to a receiver.

According to one aspect, there is provided a decoding method performed by a receiver for decoding data from a message M received from a transmitter. The decoding method is preferably, but not necessarily, a fountain-code based decoding method. The receiver typically uses a decoding matrix C in the decoding. Furthermore, the above-mentioned message M is split into a pre-defined number n of sub-messages $M1, \ldots, Mn$. The method comprises receiving data packets $P1, \ldots, Pn$ from the transmitter. The received data packets $P1, \ldots, Pn$ are formed by a linear combination of the sub-messages according to $Pn = Cn1*M1 + Cn2*M2 + Cn3*M3 + \ldots + Cnn*Mn$. Pn is a n:th data packet, C is the decoding matrix with element $Cij$ at position $(i,j)$ and Mn is a n:th sub-message. The method further comprises decoding the received data packets $P1, \ldots, Pn$ according to $Mn = Cnn\hat{\,}(-1)*(Pn - C(N-1)*M(N-1) - \ldots - C(1)*M(1))$ as the data packets $P1, \ldots, Pn$ are received. Also, the decoding is performed sequentially with the arrival (i.e. reception) of the data packets.

Preferably, but not necessarily, the decoding of the received data packets $P1, \ldots, Pn$ is performed until a decoding of a received packet is unsuccessful. The method may then further comprise receiving all remaining data packets of the n data packets, and decoding said remaining data packets in response to that all remaining data packets have been received.

According to another aspect, there is provided a corresponding encoding method performed by a transmitter for encoding data of a message M to be transmitted to a receiver. The encoding method is preferably, but not necessarily, a fountain-code based encoding method. The method comprises splitting said message M into a pre-defined number n of sub-messages $M1, \ldots, Mn$. Also, the method comprises forming data packets by means of a linear combination of said sub-messages according to $Pn = Cn1*M1 + Cn2*M2 + Cn3*M3 + \ldots + Cnn*Mn$. Pn is a n:th data packet, C is an encoding matrix with element $Cij$ at position $(i,j)$ and Mn is a n:th sub-message. Moreover, the method comprises transmitting the formed data packets $(P1, \ldots, Pn)$ to the receiver.

According to yet another aspect, there is provided a receiver for decoding data from a message M receivable from a transmitter. The receiver may be suitable for fountain-code based decoding. The receiver is configured to use a decoding matrix C in the decoding. Furthermore, the message (M) is split into a pre-defined number (n) of sub-messages $M1, \ldots, Mn$. The receiver comprises a receiving module configured to receive data packets $P1, \ldots, Pn$ from the transmitter. The received data packets are formed by a linear combination of said sub-messages according to $Pn=Cn1*M1+Cn2*M2+Cn3*M3+ \ldots +Cnn*Mn$, where Pn is a n:th data packet, C is the decoding matrix with element Cij at position (i,j) and Mn is a n:th sub-message. Also, the receiver comprises a decoder configured to decode the received data packets $P1, \ldots, Pn$ according to $Mn=Cnn^{(-1)}*(Pn-C(N-1)*M(N-1)- \ldots -C(1)*M(1))$ as the data packets $P1, \ldots, Pn$ are received. Moreover, the decoder is configured to perform the decoding sequentially with the arrival of the data packets.

In an embodiment, the decoder is configured to perform the decoding of received data packets $P1, \ldots, Pn$ until a decoding is unsuccessful. In an embodiment, the receiving module is configured to receive all remaining data packets of the n data packets and the decoder is configured to decode said remaining data packets in response to that all remaining data packets have been received.

According to still another aspect, there is provided a transmitter for encoding data of a message M to be transmitted to a receiver. The transmitter may be suitable for fountain-code based decoding. The transmitter comprises an encoder configured to split said message into a pre-defined number n of sub-messages $M1, \ldots, Mn$ and to form data packets by means of a linear combination of said sub-messages according to $Pn=Cn1*M1+Cn2*M2+Cn3*M3+ \ldots +Cnn*Mn$, where Pn is an n:th data packet, C is an encoding matrix with element Cij at position (i,j) and Mn is a n:th sub-message. Also, the transmitter comprises a transmitting module configured to transmit the formed data packets $P1, \ldots, Pn$ to the receiver.

According to a further aspect, there is provided a system comprising the above-mentioned transmitter and the above-mentioned receiver.

The various embodiments described herein may provide advantages. By allowing for performing the decoding sequentially with the arrival of the data packets it is possible to perform a significant portion of the calculations associated with the decoding already at the reception of the data packets. Thus, it is not necessary to wait for the reception of all data packets before the message M is decoded. Thus, any potential decoding delay may be reduced. This reduces the total waiting time and, consequently, the latency is reduced.

BRIEF DESCRIPTION OF THE DRAWINGS

These and other aspects, features and advantages will be apparent and elucidated from the following description of various embodiments, reference being made to the accompanying drawings, in which.

DETAILED DESCRIPTION

The technology will now be described more fully hereinafter with reference to the accompanying drawings, in which certain embodiments are shown. The technology may, however, be embodied in many different forms and should not be construed as limited to the embodiments set forth herein; rather, these embodiments are provided by way of example so that this disclosure will be thorough and complete, and will fully convey the scope of the technology to those persons skilled in the art. Like reference numbers refer to like elements or method steps throughout the description.

In one of its aspects, this disclosure relates to a fountain-code based decoding method and a corresponding fountain-code based encoding method. The inventor has realized that fountain-code based encoding/decoding may be particularly advantageous in radio communication networks where there is a demand or requirement for low latency over the communication channel. Fountain codes (such as Raptor codes) are so called rate-less codes where the main idea is to transmit a continuous stream of smaller packets without requiring non-acknowledgement (NACK) signals from the receiver in order to minimize the latency caused from the transmitter waiting for the receiver to ask for acknowledge or asking for retransmission. More detailed information on fountain codes may be found in literature, such as "Fountain Codes" by Gauri Joshi, et al. published on Dec. 7, 2010. The following detailed description will focus on fountain-code based encoding/decoding. However, persons skilled in the art will appreciate that the principles of the described technology are not necessarily limited to fountain-code based encoding/decoding.

Figure 1:
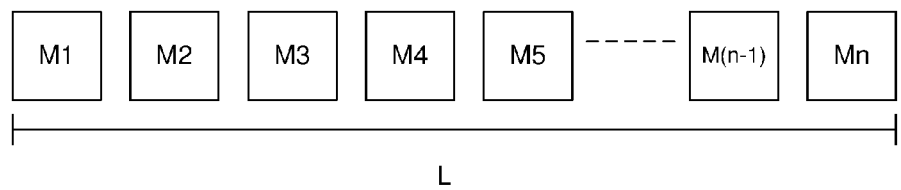
FIG. 1 shows a message divided into sub-messages.

FIG. 1 illustrates a message M of a total length of L that is to be transmitted. A fountain-code may divide this message M into n number sub-messages (or pieces) M1, M2, M3, . . . , Mn such that the length of each sub-message is L/n. A stream of data packets is then transmitted continuously, where each data packet has a length of L/n.

The data packets may be formed by a linear combination of the original pieces $M1, \ldots, Mn$:

$$P1=C11*M1+ \ldots +C1n*Mn$$

$$P2=C21*M1+ \ldots +C2n*Mn$$

$$\ldots = \ldots$$

$$Pn=Cn1*M1++Cnn*Mn$$

Considering the vectors $P=(P1, \ldots, Pn)$ and $M=(M1, \ldots, Mn)$, it is possible to write the system of equations above as $P=C*M$, where C is a decoding matrix with element Cij in position (i,j). C is often randomly generated, and thus, the elements Cij are most likely nonzero. C should preferably be constructed such that it is invertible, see e.g. "Fountain Codes" by Gauri Joshi, et al. published on Dec. 7, 2010.

Figure 2:
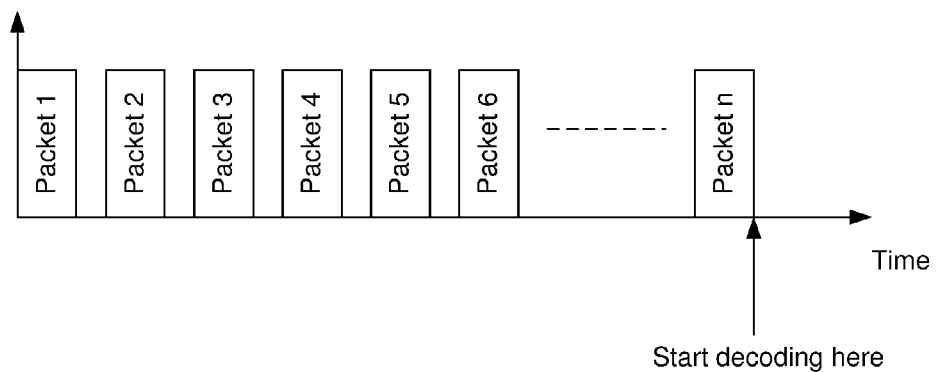
FIG. 2 shows the reception of n data packets at a receiver.

The receiver generally needs at least n packets to be able to decode the message M (and hence the original message). This means that the receiver generally needs to wait for all the n packets to arrive before it starts decoding. Also, it needs to perform $O(n^3)$ operations in order to invert the decoding matrix C to obtain the message M from the arrived data packets P. This is illustratively shown in FIG. 2, where the receiver waits for the expected amount of packets (n in this example) to arrive before starting to decode. The decoding requires a matrix inversion generally taking $O(n^3)$ operations.

For binary alphabets, it has been proposed in the publication "Triangular Codes: Systematic Erasure Codes for Finite Length Input Symbols" by Jalaluddin Qureshi et al. that the computational complexity could be reduced to $O(k^2)$ for decoding the message M from the data packets P if the decoding matrix C is chosen to have the following structure:

$$\begin{pmatrix} 1 & 2 & 2^2 & \ldots & 2^{k-1} \\ 1 & 2^2 & 2^4 & \ldots & 2^{2(k-1)} \\ 1 & 2^3 & 2^6 & \ldots & 2^{3(k-1)} \\ \vdots & & \ddots & & \vdots \\ 1 & 2^k & 2^{2k} & \ldots & 2^{k(k-1)} \end{pmatrix}$$

Figure 3:
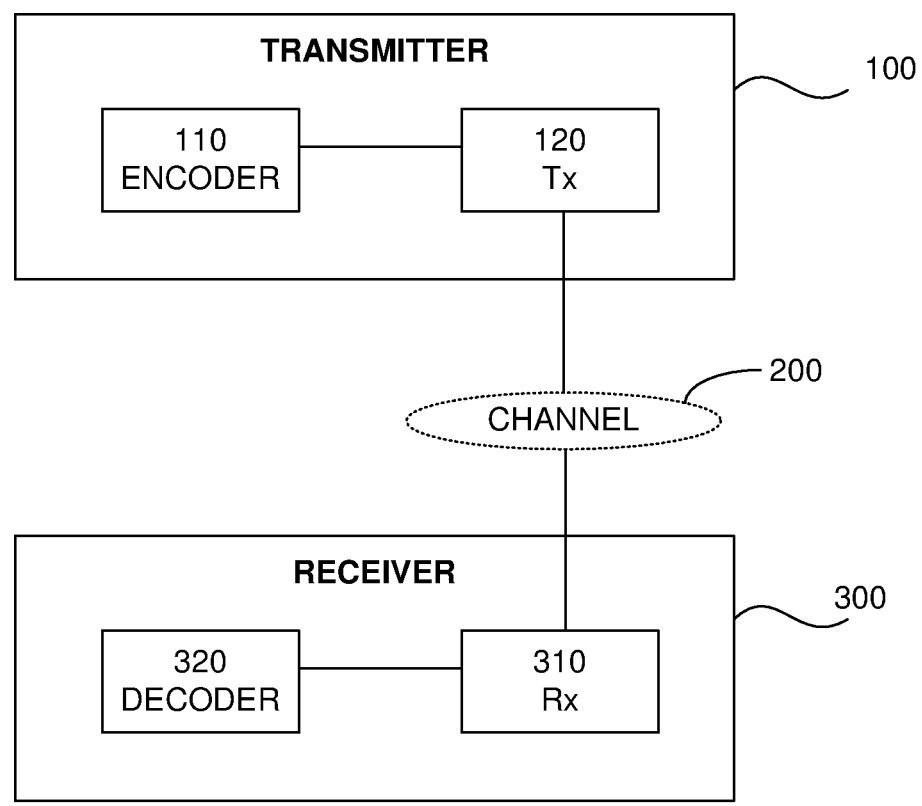
FIG. 3 illustrates an embodiment where a transmitter is communicatively connectable to a receiver over a communications channel.

Nevertheless, this corresponds to taking the bits of the message pieces Mi, i=1, . . . , k, and making shifts (multiplication of a binary number with $2^s$ is equivalent to shifting s steps to the right). However, it is not clear how this extends to symbol alphabets other than the binary. Also, there is no delay reduction as we still need to wait for at least n packets to be received and decoded correctly. In view of the above, the inventor has realized that there is still a need for further decoding delay reduction, or latency reduction. First, it generally takes too long to wait for all packets to arrive without doing anything at the receiver with the already arrived packets, thus causing unnecessary delay. For instance, the receiver generally needs to wait for all n packets to arrive, until it may decode M and then forward M1, . . . , Mn. Secondly, the n×n matrix C generally requires $O(n^3)$ operations, which is generally too big, requiring both more time and processing power for computation. The method using binary C matrix does not extend to larger alphabets. Neither does it reduce the latency in traditional fountain codes. In one of its aspects, this disclosure therefore suggests fountain-code based encoding/decoding methods. FIG. 3 illustrates an example scenario where the various embodiments described herein may be employed. A transmitter 100 is configured to encode data of a message M to be transmitted to a receiver 300, over a communication channel 200. The transmitter 100 comprises an encoder 110. The encoder 110 is configured to split the message M into a pre-defined number n of sub-messages M1, . . . , Mn and to form data packets by means of a linear combination of the sub-messages according to Pn=Cn1*M1+Cn2*M2+Cn3*M3+ . . . +Cnn*Mn, where Pn is an n:th data packet, C is an encoding matrix with element Cij at position (i,j) and Mn is a n:th sub-message. Also, a transmitting module 120 is configured to transmit the formed data packets P1, . . . , Pn to the receiver 300. Furthermore, the receiver 300 is configured to decode data from a message M received from the transmitter 100. Also, the receiver 300 is configured to use a decoding matrix C in the decoding. As described above, the message M is split into a pre-defined number n of sub-messages M1, . . . , Mn. The receiver 300 comprises a receiving module 310 configured to receive data packets P1, . . . , Pn from the transmitter 100, wherein the received data packets are formed by a linear combination of the sub-messages according to Pn=Cn1*M1+Cn2*M2+Cn3*M3+ . . . +Cnn*Mn, where Pn is a n:th data packet, C is the decoding matrix with element Cij at position (i,j) and Mn is a n:th sub-message. Also, a decoder 320 is provided to decode the received data packets P1, . . . , Pn according to $Mn=Cnn^{(-1)}*(Pn-C(N-1)*M(N-1)- \ldots -C(1)*M(1))$ as the data packets P1, . . . , Pn are received. Furthermore, the decoder 320 is configured to perform the decoding sequentially with the arrival of the data packets.

In some embodiments, the decoder 320 is also configured to perform the decoding of received data packets P1, . . . , Pn until a decoding is unsuccessful. For instance, the receiving module 310 may be configured to receive all remaining data packets of the n data packets and the decoder 320 may be further configured to decode said remaining data packets in response to that all remaining data packets have been received.

Figure 4:
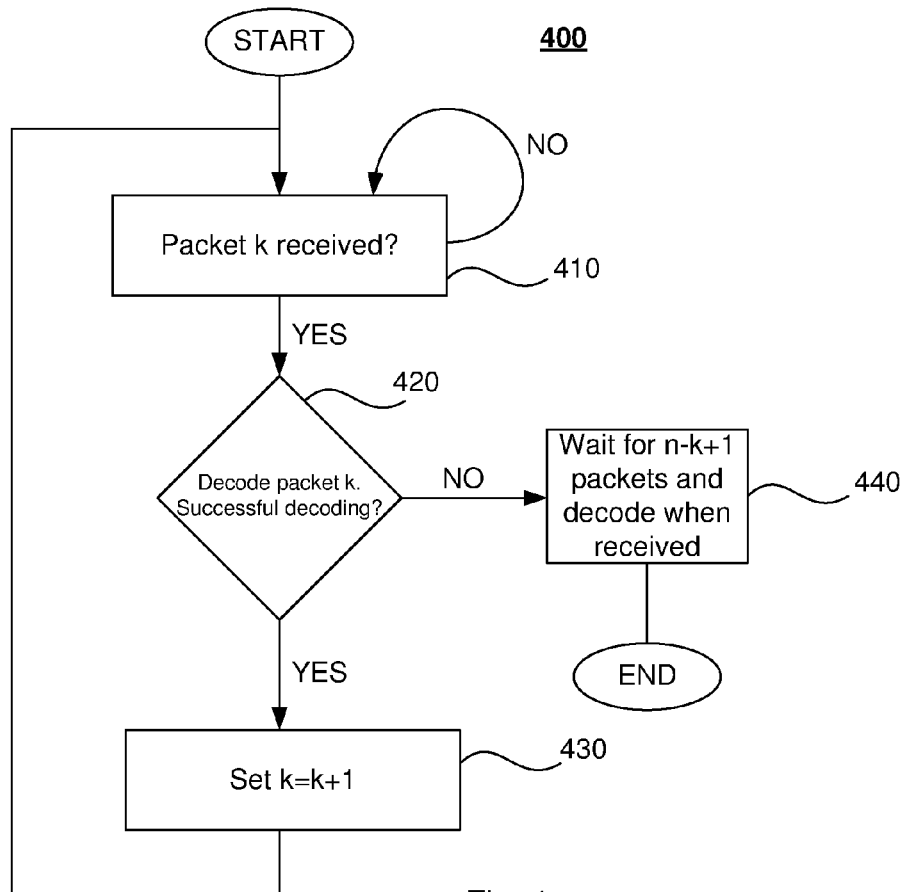
FIG. 4 is a flowchart illustrating an embodiment of method steps executable by a receiver.
Figure 5:
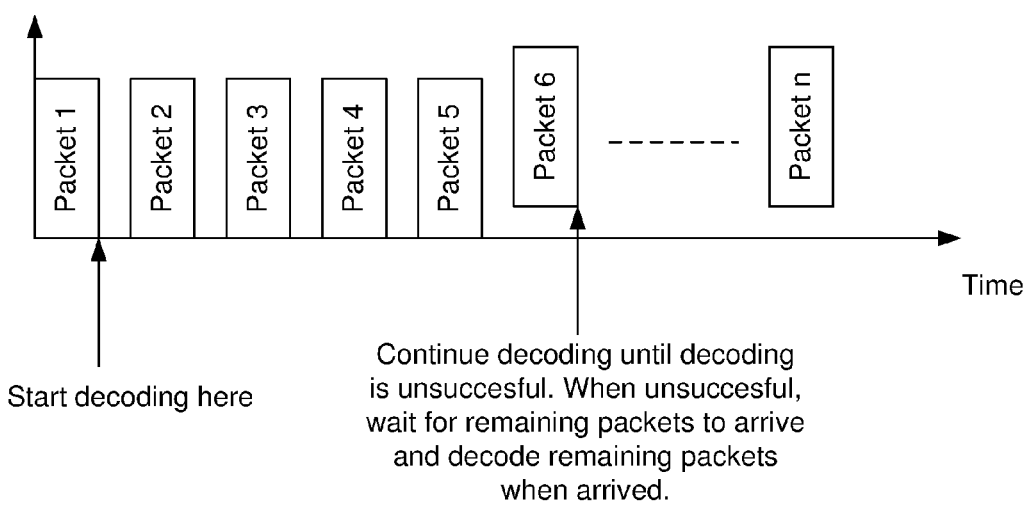
FIG. 5 shows the reception of n data packets at a receiver.

With reference to FIGS. 4 and 5, an example embodiment of a method 400 which is performed by, or otherwise executed in, a receiver 300 will be described in more detail. As will be appreciated, the receiver 300 uses a decoding matrix C in the decoding. Furthermore, a received message M is generally split into a pre-defined number n of sub-messages M1, . . . , Mn.

According to this example embodiment, data packets are formed with a following structure:

$P1=C11*M1$ $P2=C21*M1+C22*M2$ $P3=C31*M1+C32*M2+C33*M3$

. . . = . . .

$Pn=Cn1*M1+Cn2*M2+Cn3*M3+ \ldots +Cnn*Mn$

In the above formulas, Pn is the n:th data packet, C is the decoding matrix with element Cij at position (i,j) and Mn is a n:th sub-message of the message M, see FIG. 1.

The method 400 comprises receiving 410 data packets P1, . . . , Pn from the transmitter 100. The received data packets P1, . . . , Pn are formed by a linear combination of said sub-messages according to Pn=Cn1*M1+Cn2*M2+Cn3*M3+ . . . +Cnn*Mn, as illustrated hereinabove. Next, the received data packets P1, . . . , Pn are decoded according to $Mn=Cnn^{(-1)}*(Pn-C(N-1)*M(N-1)- \ldots -C(1)*M(1))$ as the data packets P1, . . . , Pn are received, wherein the decoding may be performed sequentially with the arrival of the data packets P1, . . . , Pn. Preferably, but not necessarily, the decoding 420 of the received data packets P1, . . . , Pn is performed until a decoding of a received packet is unsuccessful. If, or when, the decoding 420 of a received data packet P1, . . . , Pn is unsuccessful, the method may comprise receiving 440 all remaining data packets of the n data packets, and decoding said remaining data packets when all remaining data packets have been received. That is, the method 400 may comprise waiting for the reception of all remaining data packets and once all remaining data packets have been received the method 400 may continue by decoding the received remaining data packets.

FIG. 5 illustrates that the method 400 allows for decoding already after a first data packet transmission and this may continue until a data packet arrives with an error. As long as the first k packets arrive correctly, the sub-messages M1, . . . , Mk will be decoded before the end of transmission. After receiving the first data packet P1, sub-message M1 may be decoded according to $M1=C11^{(-1)}*P1$. After receiving P2, M2 may be decoded according to $M2=C22^{(-1)}*(P2-C21*M1)$. The method 400 may continue until packet k has not arrived correctly or k=n+1. Then, the method 400 stops decoding and wait until all n remaining data packets have arrived. Once all n remaining data packets are received, the remaining n−k+1 sub-messages may be decoded. An advantage with this decoding is that the total number of operations, or calculations, to find the first k sub-messages M1, . . . , Mk from P1, . . . , Pk is $O(k^2)$. This follows from the triangular structure of the matrix C. It is well known that a triangular matrix of size k×k has complexity of calculating the inverse equal to $O(k^2)$. In the case when a packet Pk is not received correctly, then k−1 sub-message are decoded, and the remaining n−k+1 sub-messages consume a shorter time to decode compared to the state of art where all n pieces are decoded at once. In other words, the method 400 allows for a decoding delay reduction and, consequently, the latency may be improved.

As a mere example, suppose that all n packets are arrived (i.e. received) correctly. The conventional fountain codes will require $O(n^3)$ operations to decode the message M. Thus, the decoding would require relatively much time and energy for computations, or calculations. Assume for instance n=1000. Then, $n^3$=1000 000 000. Time is proportional to the number of operations, so it would take $O(n^3)$ time steps before the receiver decodes the message M. On the other hand, when applying the method 400 when the n:th packet arrives, it is only needed to perform one last operation to decode Mn, since M1, M(n−1) were already decoded on the fly. This only consumes time in the order of $O(1)$. Also, the total number of operations to invert the matrix C is $O(n^2)$ (as opposed to $O(n^3)$ for a general matrix C), making it more energy efficient and faster to compute, or calculate.

Figure 6:
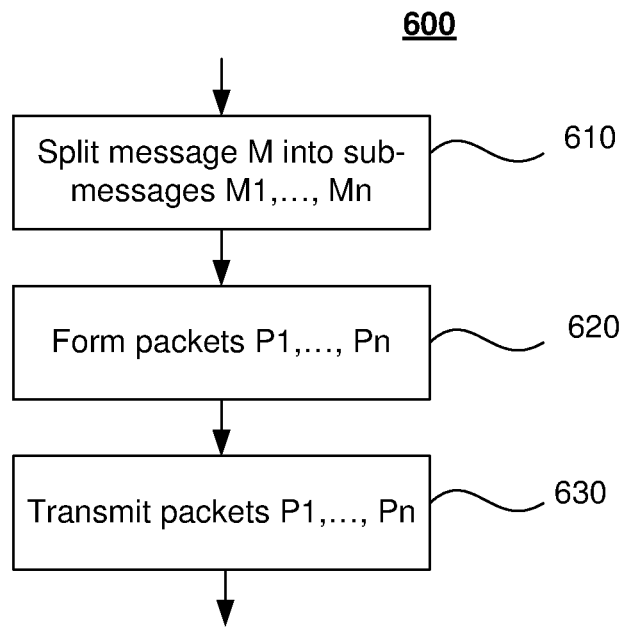
FIG. 6 is a flowchart illustrating an embodiment of method steps executable by a transmitter.

With reference to FIG. 6, an example embodiment of a corresponding encoding method 600 which is performed by, or otherwise executed in, a transmitter 100 will be described in more detail. A message M to be transmitted to a receiver 300 is split 610 into (thus, divided into) a pre-defined number n of sub-messages M1, . . . , Mn. Next, data packets P1, . . . , Pn are formed, or construed, by means of a linear combination of the sub-messages according to the following formula: Pn=Cn1*M1+Cn2*M2+Cn3*M3+ . . . +Cnn*Mn, where Pn is a n:th data packet, C is an encoding matrix with element Cij at position (i,j) and Mn is a n:th sub-message. Finally, the formed data packets are transmitted 630 to the receiver 300.

Figure 7:
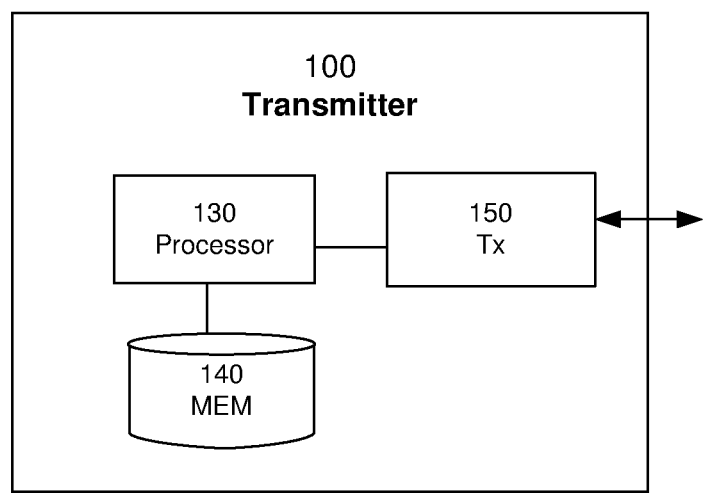
FIG. 7 illustrates an embodiment of a transmitter.
Figure 8:
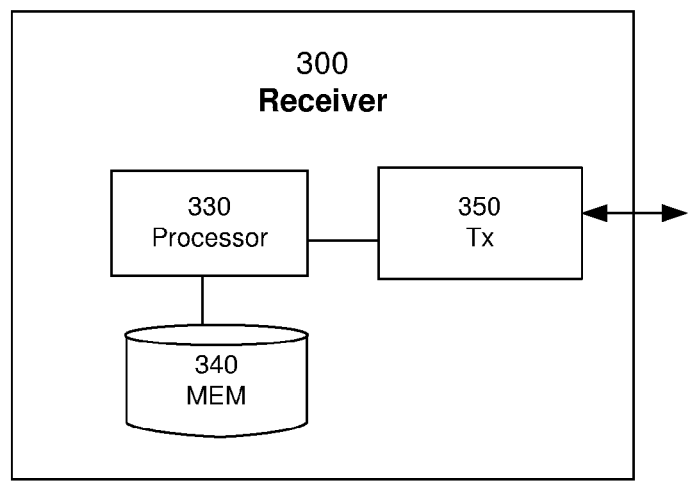
FIG. 8 illustrates an embodiment of a receiver.

FIGS. 7 and 8 illustrate alternative embodiments of the transmitter 100 and the receiver 300, respectively.

As may be seen in FIG. 7, the transmitter 100 comprises a processor 130, a memory 140 and a transmitting module (Tx) 150. The memory 140 may comprise instructions executable by the processor 130 whereby the transmitter 100 is operative to split a message M into a pre-defined number n of sub-messages M1, . . . , Mn. Also, the memory 140 may comprise instructions executable by the processor 130 whereby the transmitter 100 is operative to form data packets by means of a linear combination of said sub-messages according to Pn=Cn1*M1+Cn2*M2+Cn3*M3+ . . . +Cnn*Mn, where Pn is a n:th data packet, C is an encoding matrix with element Cij at position (i,j) and Mn is a n:th sub-message. Furthermore, the transmitting module (Tx) 150 may be configured to transmit, or signal, the formed data packets P1, . . . , Pn to the receiver.

With reference to FIG. 8, the receiver 300 comprises a processor 330, a memory 340 and a receiving module (Rx) 350. The receiver 300 is configured to use a decoding matrix C in the decoding. A message M received from the transmitter 100 is generally split into a pre-defined number n of sub-messages M1, . . . , Mn. The receiving module (Rx) 350 may be configured to receive data packets P1, . . . , Pn from the transmitter, wherein the received data packets P1, . . . , Pn are formed by a linear combination of said sub-messages according to Pn=Cn1*M1+Cn2*M2+Cn3*M3+ . . . +Cnn*Mn, where Pn is a n:th data packet, C is the decoding matrix with element Cij at position (i,j) and Mn is a n:th sub-message. Moreover, the memory 340 may comprise instructions executable by the processor 330 whereby the receiver 300 is operative to decode the received data packets P1, . . . , Pn according to Mn=Cnn^(−1)*(Pn−C(N−1)*M(N−1)− . . . −C(1)*M(1)) as the data packets are received P1, . . . , Pn such that or wherein the decoding is performed sequentially with the arrival of the data packets.

As will be appreciated by persons skilled in the art, the described embodiments and their equivalents may be realized in software or hardware or a combination thereof. They may be performed by general purpose circuits associated with or integral to a communication device, such as digital signal digital signal processors (DSP), central processing units (CPU), co-processor units, field programmable gate arrays (FPGA) or other programmable hardware, or by specialized circuits such as for example application-specific integrated circuits (ASIC). Embodiments described herein may appear within an electronic apparatus, such as a wireless communication device.

Figure 9:
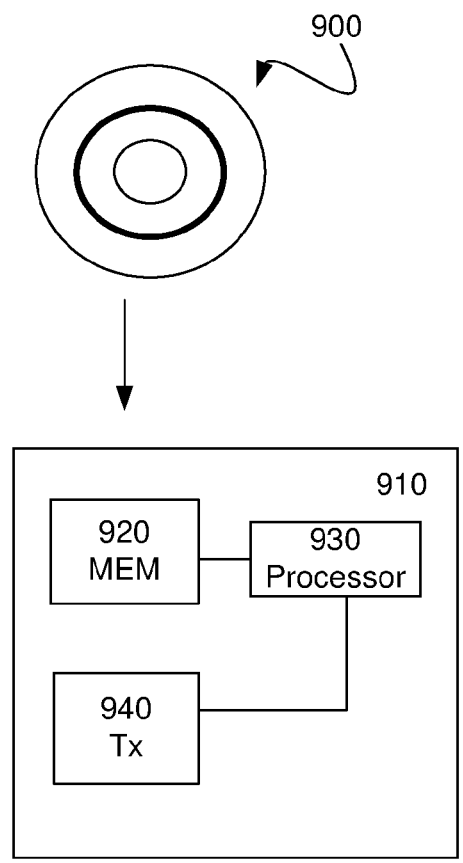
FIG. 9 is schematic drawing illustrating a computer program product according to an embodiment.

According to some embodiments, computer programs are provided. In one embodiment, a computer program comprises instructions which, when executed on at least one processor, cause the at least one processor to split a message M into a pre-defined number n of sub-messages M1, . . . , Mn and to form data packets by means of a linear combination of said sub-messages according to Pn=Cn1*M1+Cn2*M2+Cn3*M3+ . . . +Cnn*Mn, where Pn is a n:th data packet, C is an encoding matrix with element Cij at position (i,j) and Mn is a n:th sub-message. Furthermore, a carrier containing the computer program may be provided. The carrier may e.g. be an electronic signal, an optical signal, a radio signal or a computer-readable storage medium. FIG. 9 illustrates an embodiment where the carrier is a computer readable medium such as, for example, a diskette or a CD-ROM 900. The computer readable medium 900 may have the above-mentioned computer program stored thereon. The computer program may thus be loadable into a data-processing unit 930, or processor, which may, for example, be comprised in an arrangement 910. When loaded into the processor 930, the computer program may be stored in a memory 920 associated with or integral to the processor 930. The arrangement 910 generally also comprises a transmitting module (Tx) 940. Thus, the transmitting module (Tx) 910 may be configured to transmit the formed data packets P1, . . . , Pn to a receiver. The arrangement 910 may be embodied as an encoder. Furthermore, the arrangement 910 may be comprised in a transmitter 100.

Figure 10:
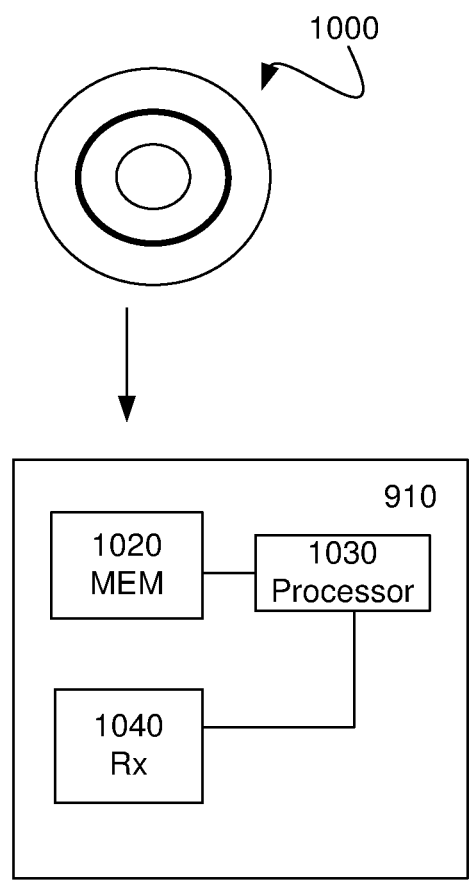
FIG. 10 is another schematic drawing illustrating a computer program product according to an embodiment.

In an embodiment, a computer program comprises instructions which, when executed on at least one processor, cause the at least one processor to decode received data packets P1, . . . , Pn according to Mn=Cnn^(−1)*(Pn−C(N−1)*M(N−1)− . . . −C(1)*M(1)) as the data packets P1, . . . , Pn are received. Furthermore, a carrier containing the computer program may be provided. The carrier may e.g. be an electronic signal, an optical signal, a radio signal or a computer-readable storage medium. FIG. 10 illustrates an embodiment where the carrier is a computer readable medium such as, for example, a diskette or a CD-ROM 1000. The computer readable medium 1000 may have the above-mentioned computer program stored thereon. The computer program may thus be loadable into a data-processing unit 1030, or processor, which may, for example, be comprised in an arrangement 1010. When loaded into the processor 1030, the computer program may be stored in a memory 1020 associated with or integral to the processor 1030. The arrangement 1010 generally also comprises a receiving module (Rx) 940. Thus, the receiving module (Rx) 1010 may be configured to configured to receive data packets P1, . . . , Pn from the transmitter 100, wherein the received data packets are formed by a linear combination of said sub-messages according to Pn=Cn1*M1+Cn2*M2+Cn3*M3+ . . . +Cnn*Mn, where Pn is a n:th data packet, C is the decoding matrix with element Cij at position (i,j) and Mn is a n:th sub-message. The arrangement 1010 may be embodied as a decoder. Furthermore, the arrangement 1010 may be comprised in a receiver 300.

The various embodiments that have been described in this disclosure are advantageous. By allowing for performing the decoding sequentially with the arrival (i.e. reception) of the data packets it is possible to perform a significant portion of the calculations, or computations, associated with the decoding already at the arrival (i.e. reception) of the data packets at the receiver. Thus, it is not necessary to wait for the reception of all data packets before the whole message M is decoded. Thus, any potential decoding delay may be reduced. This reduces the total waiting time and, consequently, the latency may be reduced. In some embodiments, the decoding of the received data packets is performed only until a decoding of a received packet is unsuccessful. The method may then further comprise receiving all remaining data packets of the n data packets, and decoding said remaining data packets in response to that all remaining data packets have been received. This will typically also improve the latency compared to the conventional case where all received data packets are received before the decoding of the message M is started.

Modifications and other variants of the described embodiments will come to mind to one skilled in the art having benefit of the teachings presented in the foregoing description and associated drawings. Therefore, it is to be understood that the embodiments are not limited to the specific example embodiments disclosed and that modifications and other variants are intended to be included within the scope of this disclosure. Although specific terms may be employed herein, they are used in a generic and descriptive sense only and not for purposes of limitation. Therefore, a person skilled in the art would recognize numerous variations to the described embodiments that would still fall within the scope of the appended claims. As used herein, the terms "comprise/comprises" or "include/includes" do not exclude the presence of other elements or steps. Furthermore, although individual features may be included in different claims, these may possibly advantageously be combined, and the inclusion of different claims does not imply that a combination of features is not feasible and/or advantageous. Also, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims. In addition, singular references do not exclude a plurality. Finally, reference signs in the claims are provided merely as a clarifying example and should not be construed as limiting the scope of the claims in any way.

Abbreviations $O(\acute{n}\ k)$=A number of order $\acute{n}\ k$.

The invention claimed is:

1. A decoding method performed by a receiver for decoding data from a message M received from a transmitter, wherein the receiver uses a decoding matrix C in the decoding, and wherein said message M is split into a pre-defined number n of sub-messages M1 to Mn, the decoding method comprising:

receiving data packets from the transmitter, wherein the received data packets are formed by a linear combination of said sub-messages M1 to Mn according to:

$$P1=C11*M1$$

$$P2=C21*M1+C22*M2$$

$$\ldots=\ldots$$

$$Pn=Cn1*M1+Cn2*M2+Cn3*M3+\ldots+Cnn*Mn,$$

where Pn is an n-th data packet, C is the decoding matrix with element Cij at position (i,j) and Mn is an n-th sub-message of said message M;

decoding said sub-messages M1 to Mn from the received data packets until a decoding of a sub-message from the received data packets is unsuccessful, wherein the decoding of said sub-messages M1 to Mn is performed according to:

$$M1=C11\hat{\ }(-1)*P1$$

$$M2=C22\hat{\ }(-1)*(P2-C21*M1)$$

$$\ldots=\ldots$$

$$Mn=Cnn\hat{\ }(-1)*(Pn-C(N-1)*M(N-1)-\ldots-C(1)*M\quad(1))$$

as the data packets are received, wherein the decoding of said sub-messages M1 to Mn is performed sequentially with an arrival of the data packets, and wherein the sequential decoding of said sub-messages M1 to Mn with the arrival of the data packets allows performing a significant portion of calculations associated with the decoding of said sub-messages M1 to Mn already at the reception of the data packets;

receiving all remaining data packets when the decoding, of said sub-message from the received data packets, is unsuccessful; and decoding, all remaining sub-messages from said all remaining data packets, in response to a determination that said all remaining data packets have been received, thereby reducing a delay in the decoding of said sub-messages M1 to Mn from the received data packets.

2. An encoding method performed by a transmitter for encoding data of a message M to be transmitted to a receiver, the encoding method comprising:

splitting said message M into a pre-defined number n of sub-messages M1 to Mn;

forming data packets by means of a linear combination of said sub-messages M1 to Mn according to:

$$P1=C11*M1$$

$$P2=C21*M1+C22*M2$$

$$\ldots=\ldots$$

$$Pn=Cn1*M1+Cn2*M2+Cn3*M3+\ldots+Cnn*Mn,$$

where Pn is an n-th data packet, C is an encoding matrix with element Cij at position (i,j) and Mn is an n-th sub-message of said message M; and transmitting the formed data packets to the receiver, wherein the receiver sequentially decodes said sub-messages M1 to Mn from the formed data packets with an arrival of the formed data packets, wherein the sequential decoding is performed until a decoding of a sub-message from the formed data packets is unsuccessful, wherein the sequential decoding allows the receiver to perform a significant portion of calculations associated with the decoding of said sub-messages M1 to Mn already at a reception of the formed data packets, wherein the receiver receives all remaining formed data packets when the decoding, of said sub-message from the received data packets, is unsuccessful, and wherein the receiver further decodes, all remaining sub-messages from said all remaining formed data packets, in response to a determination that said all remaining formed data packets have been received, thereby reducing a delay in the decoding of said sub-messages M1 to Mn from the formed data packets.

3. A receiver for decoding data from a message M receivable from a transmitter, wherein the receiver is configured to use a decoding matrix C in the decoding, and wherein said message M is split into a pre-defined number n of sub-messages M1 to Mn, the receiver comprising:

a receiving circuit configured to receive data packets from the transmitter, wherein the received data packets are formed by a linear combination of said sub-messages M1 to Mn according to:

$$P1 = C11 * M1$$

$$P2 = C21 * M1 + C22 * M2$$

$$\ldots = \ldots$$

$$Pn = Cn1 * M1 + Cn2 * M2 + Cn3 * M3 + \ldots + Cnn * Mn,$$

where Pn is an n-th data packet, C is the decoding matrix with element Cij at position (i,j) and Mn is an n-th sub-message of said message M; and a processing circuit configured to decode said sub-messages M1 to Mn from the received data packets until a decoding of a sub-message from the received data packets is unsuccessful, wherein the decoding of said sub-messages M1 to Mn is performed according to:

$$M1 = C11\char`\^(-1) * P1$$

$$M2 = C22\char`\^(-1) * (P2 - C21 * M1)$$

$$\ldots = \ldots$$

$$Mn = Cnn\char`\^(-1) * (Pn - C(N-1) * M(N-1) - \ldots - C(1) * M(1))$$

as the data packets are received, wherein the processing circuit is configured to decode said sub-messages M1 to Mn from the received data packets sequentially with an arrival of the data packets, wherein the sequential decoding of said sub-messages M1 to Mn with the arrival of the data packets allows performing a significant portion of calculations associated with the decoding of said sub-messages M1 to Mn already at the reception of the data packets, wherein the receiving circuit is further configured to receive all remaining data packets when the decoding, of said sub-message from the received data packets, is unsuccessful;

and the processing circuit is further configured to decode, all remaining sub-messages from said all remaining data packets, in response to a determination that said all remaining data packets have been received, thereby reducing a delay in the decoding of said sub-messages M1 to Mn from the received data packets.

4. A transmitter for encoding data of a message M to be transmitted to a receiver, the transmitter comprising:

a processing circuit configured to split said message M into a pre-defined number n of sub-messages M1 to Mn, and to form data packets by means of a linear combination of said sub-messages M1 to Mn according to:

$$P1 = C11 * M1$$

$$P2 = C21 * M1 + C22 * M2$$

$$\ldots = \ldots$$

$$Pn = Cn1 * M1 + Cn2 * M2 + Cn3 * M3 + \ldots + Cnn * Mn,$$

where Pn is an n-th data packet, C is an encoding matrix with element Cij at position (i,j) and Mn is an n-th sub-message of said message M; and a transmitting circuit configured to transmit the formed data packets to the receiver, wherein the receiver sequentially decodes said sub-messages M1 to Mn from the formed data packets with an arrival of the formed data packets, wherein the sequential decoding is performed until a decoding of a sub-message from the formed data packets is unsuccessful, wherein the sequential decoding allows the receiver to perform a significant portion of calculations associated with the decoding of said sub-messages M1 to Mn already at a reception of the formed data packets, wherein the receiver receives all remaining formed data packets when the decoding, of said sub-message from the formed data packets, is unsuccessful, and wherein the receiver further decodes, all remaining sub-messages from said all remaining formed data packets, in response to a determination that said all remaining formed data packets have been received, thereby reducing a delay in the decoding of said sub-messages M1 to Mn from the formed data packets.

5. A system comprising:

a transmitter configured to encode data of a message M, wherein the transmitter comprises:

a processing circuit configured to split said message M into a pre-defined number n of sub-messages M1 to Mn, and to form data packets by means of a linear combination of said sub-messages M1 to Mn according to:

$$P1 = C11 * M1$$

$$P2 = C21 * M1 + C22 * M2$$

$$\ldots = \ldots$$

$$Pn = Cn1 * M1 + Cn2 * M2 + Cn3 * M3 + \ldots + Cnn * Mn,$$

where Pn is an n-th data packet, C is an encoding matrix with element Cij at position (i,j) and Mn is an n-th sub-message of said message M, and a transmitting circuit configured to transmit the formed data packets; and a receiver configured to use a decoding matrix in decoding said sub-messages M1 to Mn from the formed data packets, wherein the receiver comprises:

a receiving circuit configured to receive the formed data packets from the transmitter, and a processing circuit configured to decode said sub-messages M1 to Mn from the received formed data packets until a decoding of a sub-message from the received formed data packets is unsuccessful, wherein the decoding of said sub-messages M1 to Mn is performed according to:

$M1=C11\textasciicircum(-1)*P1$ $M2=C22\textasciicircum(-1)*(P2-C21*M1)$ $\ldots = \ldots$ $Mn=Cnn\textasciicircum(-1)*(Pn-C(N-1)*M(N-1)- \ldots -C(1)*M(1))$ (1)

as the formed data packets are received, wherein the processing circuit is configured to decode said sub-messages M1 to Mn from the received formed data packets sequentially with an arrival of the received formed data packets, wherein the sequential decoding of said sub-messages M1 to Mn with the arrival of the received formed data packets allows performing a significant portion of calculations associated with the decoding of said sub-messages M1 to Mn already at the reception of the data packets, wherein the receiving circuit is further configured to receive all remaining formed data packets when the decoding, of said sub-message from the received data packets, is unsuccessful, and wherein the processing circuit is further configured to decode, all remaining sub-messages from said all remaining formed data packets, in response to a determination that said all remaining formed data packets have been received, thereby reducing a delay in the decoding of said sub-messages M1 to Mn from the received formed data packets.

* * * * *